United States Patent … US 7,959,055 B2
Zen et al. … Date of Patent: Jun. 14, 2011

(54) WAVE SOLDERING TANK

(75) Inventors: Mitsuo Zen, Souka (JP); Hirokazu Ichikawa, Souka (JP); Satoshi Ozawa, Chiba (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 12/225,925

(22) PCT Filed: Apr. 2, 2007

(86) PCT No.: PCT/JP2007/057375

§ 371 (c)(1), (2), (4) Date: May 11, 2009

(87) PCT Pub. No.: WO2007/116853

PCT Pub. Date: Oct. 18, 2007

(65) Prior Publication Data

US 2010/0001047 A1    Jan. 7, 2010

(30) Foreign Application Priority Data

Apr. 5, 2006    (JP) ................................. 2006-103736

(51) Int. Cl.
B23K 1/08 (2006.01)
B23K 31/02 (2006.01)

(52) U.S. Cl. ............... 228/37; 228/33; 228/34; 228/260

(58) Field of Classification Search .................... 228/37, 228/260, 33, 34, 261
See application file for complete search history.

(56) References Cited

U.S. PATENT DOCUMENTS 4,700,878 A * 10/1987 Ciniglio .......................... 228/37
6,851,596 B2 * 2/2005 Ogawa ............................ 228/37
2008/0093417 A1 * 4/2008 Takaguchi et al. ............. 228/37

FOREIGN PATENT DOCUMENTS

| JP | 48 19425 | 6/1973 |
|---|---|---|
| JP | 48 55025 | 7/1973 |
| JP | 48 98520 | 11/1973 |
| JP | 50 148327 | 12/1975 |
| JP | 51 3632 | 1/1976 |
| JP | 56 023371 | 3/1981 |
| JP | 62 259665 | 11/1987 |
| JP | 63 87293 | 6/1988 |
| JP | 1 114165 | 8/1989 |
| JP | 6 19968 | 3/1994 |
| JP | 06 246433 | 9/1994 |
| JP | 11 026926 | 1/1999 |
| JP | 2005 028446 | 2/2005 |
| WO | WO 2005035176 A1 * | 4/2005 |

* cited by examiner

Primary Examiner — Kevin P Kerns
Assistant Examiner — Devang R Patel
(74) Attorney, Agent, or Firm — Michael Tobias

(57) ABSTRACT

In a wave soldering tank using a conventional screw pump, pulsation sometimes occurred in which molten solder spouting from the discharge nozzle moved up and down. The cause of the occurrence of the pulsation in a screw pump was that the gap between the screw pump and the casing was wide, so there was reverse flow through the gap. It is conceivable to narrow the gap, but if the gap is made narrow, the screw pump ends up contacting the casing if the screw pump becomes eccentric.

A wave soldering tank according to the present invention makes the diameter of the inlet in the bottom of the casing smaller than the diameter of the screw pump so that reverse flow does not take place even if the gap between the screw pump and the casing is wide. Flow is made more stable by providing outwardly flaring guide walls on the outlet of the casing.

13 Claims, 5 Drawing Sheets

Prior Art

WAVE SOLDERING TANK

TECHNICAL FIELD

This invention relates to a wave soldering tank which is installed in an automatic soldering apparatus and which carries out soldering of printed circuit boards.

BACKGROUND ART

In an automatic soldering apparatus, processing equipment such as a fluxer, a preheater, a wave soldering tank, and a cooler are arranged in series, and a conveyor runs above the processing equipment. While being transported by the conveyor, a printed circuit board undergoes flux application in the fluxer, preheating in the preheater, adhesion of solder in the wave soldering tank, and cooling in the cooler to carry out soldering.

All of the processing equipment in an automatic soldering apparatus affects the quality of soldering, but the wave soldering tank has a particularly great effect. For example, the wave soldering tank must not have pulsing in which the height of spouted solder moves up and down, and oxides which are floating in molten solder must not be enveloped therein.

A wave soldering tank carries out soldering by spouting molten solder upwards and contacting a printed circuit board with the spouted molten solder. For this purpose, a wave soldering tank requires a discharge pump for pumping molten solder and a discharge nozzle for upwardly spouting molten solder which is sent to it by the pump.

The discharge pump and the discharge nozzle are connected by a duct. The discharge pump is provided at one end of the duct, and the discharge nozzle is installed at the other end of the duct. The discharge pump is installed inside a casing formed at the end of the duct. The discharge pump sucks in molten solder and sends the molten solder to the discharge nozzle through the duct, and it spouts molten solder upwards from the discharge nozzle.

Pumps used in wave soldering tanks include impeller pumps and screw pumps. An impeller pump has a large number of plate-shaped blades radially installed on the periphery of a shaft. The casing of an impeller pump is formed at one end of a duct and has roughly the shape of a snail. The shaft of an impeller pump passes through a shaft hole formed in the top of the casing and projects above the surface of molten solder. An inlet of the casing is formed in the bottom of the casing.

As a result of rotation of the large number of blades of an impeller pump, the molten solder between the blades is thrown outwards by centrifugal force and passed through the duct and sent to the discharge nozzle. The impeller pump merely has blades radially installed on a shaft, so it is easy to manufacture and inexpensive. However, with an impeller pump, pulsation of the solder spouted from the discharge nozzle is sometimes experienced. An impeller pump causes the pulsation of molten solder since the molten solder is pumped discontinuously. Namely, in an impeller pump, after molten solder is thrown outwards from between one set of blades, molten solder is thrown outwards from between the next adjoining set of blades. In the period between the two occurrences, there is an instant in which molten solder is not thrown outwards, and this causes pulsation in an impeller pump.

A screw pump has one or more plate-shaped members helically wrapped around the periphery of a shaft. Molten solder rests on and is transported by the helical plate-shaped members. Accordingly, a screw pump does not have discontinuous operation, and theoretically it does not cause pulsations. From long in the past, there have been many proposals in patents and utility models of wave soldering tanks using screw pumps (Patent Documents 1-7).

Patent Document 1: JP S48-19425 Y
Patent Document 2: JP S48-98520 U
Patent Document 3: JP S48-55025 U
Patent Document 4: JP S50-148327 U
Patent Document 5: JP S51-3632 U
Patent Document 6: JP S62-259665 A
Patent Document 7: JP 2005-28446 A

DISCLOSURE OF INVENTION

Problem Which the Invention is to Solve

As described above, it has been thought that a screw pump theoretically does not cause pulsation. However, if a screw pump is actually installed in a wave soldering tank and carries out soldering of a printed circuit board, it sometimes causes pulsation, and problems occur such as solder covering the upperface of the printed circuit board or unsoldered portions due to poor contact. The present invention provides a wave soldering tank which adequately exhibits the advantages of a screw pump and does not cause any pulsation.

Means for Solving the Problem

As a result of diligent studies concerning the cause of pulsation in a wave soldering tank using a conventional screw pump, the present inventors found that gaps between a screw pump and a casing are a problem. Namely, as shown in FIG. 5, in the above-described conventional wave soldering tank, an inlet R is formed by the inner surface of a cylindrical casing K. Because the inner diameter $R_2$ of the inlet R is larger than the diameter $P_1$ of the screw pump P, a wide gap G is formed between the screw pump P and the casing K. Therefore, in a conventional wave soldering tank, molten solder which is sucked into the inlet R in the bottom of the casing (as shown by arrow a) attempts to flow along the duct D towards the discharge nozzle (as shown by arrow b), but it is pushed back by the resistance of molten solder which is already present inside the duct. The molten solder which is pushed back flows backward as shown by arrow c through the gap G between the screw pump P and the casing K and flows outwards from the inlet R. The molten solder which flows outwards interferes with molten solder which is being sucked in by the screw pump P (arrow a) and disturbs the molten solder which is being sucked in. When the turbulent molten solder which is sucked in is pushed out by the screw pump P, it remains turbulent, and the turbulence is thought to cause pulsation when the solder is spouted from the discharge nozzle.

According to tests by the present inventors, molten solder in upper portions does not undergo reverse flow downwards through the gap if the gap is 0.5 mm or less. It is possible to precisely form the diameter of the screw pump and the diameter of the casing so as to eliminate this gap. However, objects installed inside a wave soldering tank are invariably deformed. Therefore, even if the gap is finished to 0.5 mm, for example, a screw pump installed inside the casing will become eccentric and end up contacting the casing.

Namely, at the time of use of a wave soldering tank, a heater inside the wave soldering tank is energized and solder is maintained in a molten state. However, when the wave soldering tank is not being used, the heater no longer is energized, and the solder which had melted cools and solidifies. When a wave soldering tank is to be used again, the heater is again made to conduct and solder is heated and melted. In this manner, melting and solidification of solder are repeatedly carried out in a wave soldering tank. Solder thermally expands when it is heated by the heater, and it thermally contracts when the heater stops being energized and the solder cools. Therefore, objects inside a wave soldering tank are subjected to the thermal expansion and contraction of solder and are deformed. Accordingly, a casing or a screw pump installed inside a casing is also subjected to the thermal expansion and contraction of solder and deforms. As a result, when the gap between the screw pump and the casing is precisely finished to a small value, the screw pump becomes eccentric and rubs against the casing or is strongly pressed against the casing and can no longer smoothly rotate. As a result, in a screw pump which is precisely finished, not only does pulsation take place, but the screw pump or the casing is damaged.

In the above-described wave soldering tanks using a conventional screw pump (Patent Documents 1-7), the inlet for molten solder in the bottom of the casing has the same diameter as the inner diameter of the casing, so molten solder which flows in reverse from above as shown by arrow c in FIG. 5 flows downwardly outwards and causes turbulence of molten solder which is sucked into the screw pump P (arrow a). The present inventors discovered that if reverse flow can be prevented, pulsation no longer takes place even in a wave soldering tank having a large gap between a screw pump and a casing, and they completed the present invention.

The present invention is a wave soldering tank in which a cylindrical casing is formed at one end of a duct installed inside the wave soldering tank, a discharge nozzle is formed at the other end of the duct, and a screw pump is installed inside the casing, characterized in that an inlet having a smaller diameter than the diameter of the screw pump is formed in the bottom of the casing.

Another invention is a wave soldering tank having a cylindrical casing formed at one end of a duct installed inside the wave soldering tank, a discharge nozzle formed at the other end of the duct, and a screw pump installed inside the casing, characterized in that an inlet having a smaller diameter than the diameter of the screw pump is formed in the bottom of the casing, the upper portion of the casing is an arcuate outlet having a portion which faces in the direction of the duct, and outwardly flaring guide walls are formed on both sides of the outlet.

In a wave soldering tank according to the present invention, even if there is a wide space between the screw pump and the casing, reverse flow from above to below does not take place. Thus, pulsation does not occur. In addition, outwardly flaring guide walls are installed at the outlet of the casing to provide stable fluid flow in a soldering tank using a screw pump. The upper portion of the casing has an arcuate portion which opens in the direction of flow, and outwardly flaring guide walls are installed on both sides of the arc. In general, when a liquid to which pressure is applied flows through a narrow region, its flow speed increases and it becomes turbulent, but when a liquid to which pressure is applied flows into a wide area, it slows down and is not turbulent. As a result, by installing outwardly flaring guide walls in the outlet of the casing, flow becomes stable, and molten solder which spouts from the discharge nozzle does not undergo pulsation.

Effects of the Invention

A wave soldering tank according to the present invention does not require precise finishing of the gap between the screw pump and a casing, and it can be inexpensively manufactured. According to the present invention, even if the screw pump or the casing deforms to a certain extent due to thermal expansion and contraction of solder, the screw pump does not rub against and is not pressed against the casing, and the screw pump can stably rotate. In a wave soldering tank according to the present invention, as the diameter of the inlet formed in the bottom of the casing is smaller than the diameter of the screw pump, when molten solder which is sucked in by the screw pump flows backwards between the screw pump and the casing, it is obstructed by the inner flange of the inlet and does not flow out from the inlet. Namely, in a wave soldering tank according to the present invention, molten solder which is sucked in by the screw pump does not become turbulent. Therefore, it does not become turbulent when it leaves the screw pump and flows through the duct, and it does not undergo pulsation when it spouts from the discharge nozzle. As a result, a wave soldering tank according to the present invention can always stably contact molten solder with the surface to be soldered of a printed circuit board, and reliable soldered portions are obtained.

Figure 1:
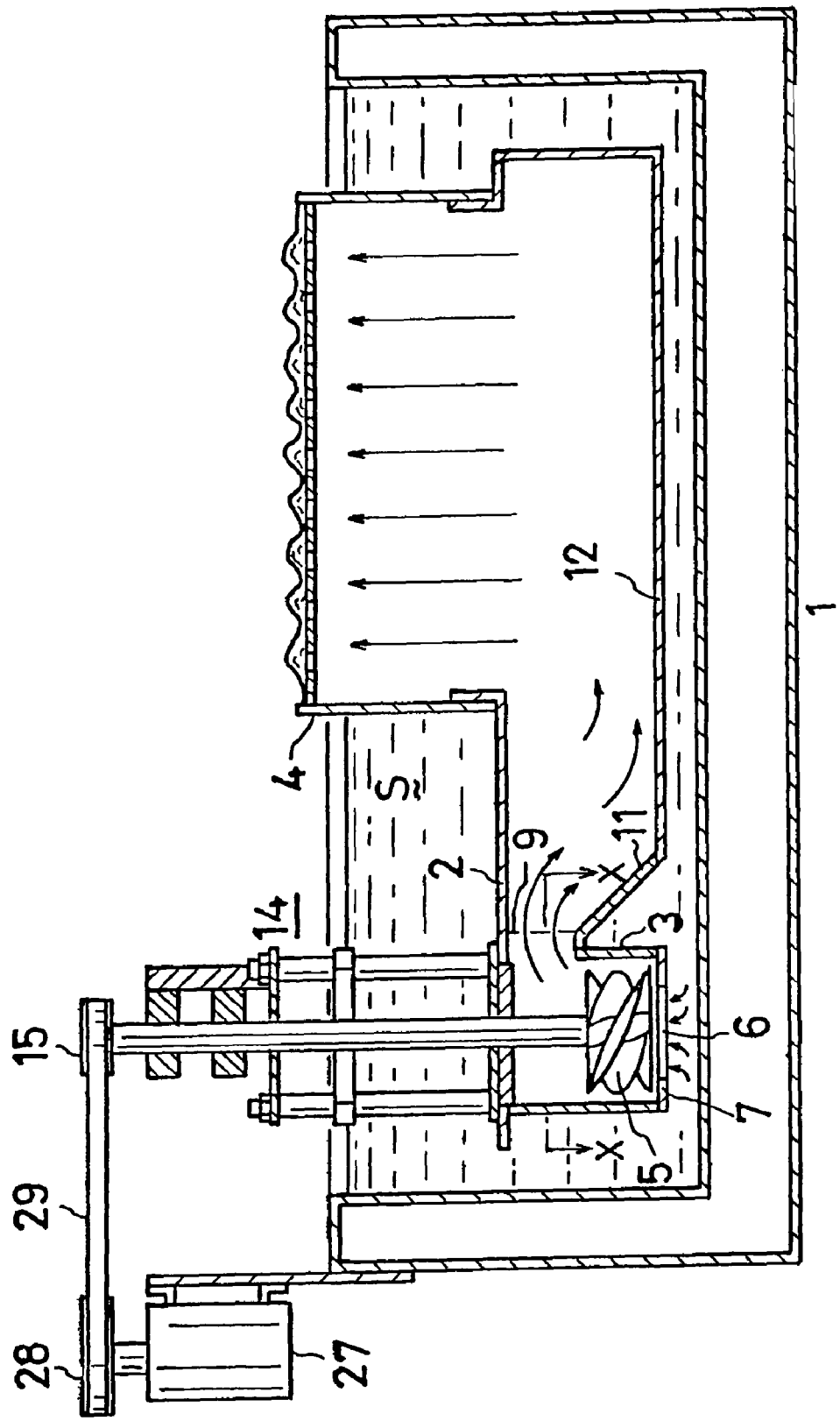
FIG. 1—This is a front cross-sectional view of a wave soldering tank according to the present invention.

EXPLANATION OF SYMBOLS 1 wave soldering tank body
2 duct
3 casing
4 discharge nozzle
5 screw pump
6 inlet
7 inner flange
8 outlet
9 guide wall
13 shaft holder

BEST MODE FOR CARRYING OUT THE INVENTION

Figure 2:
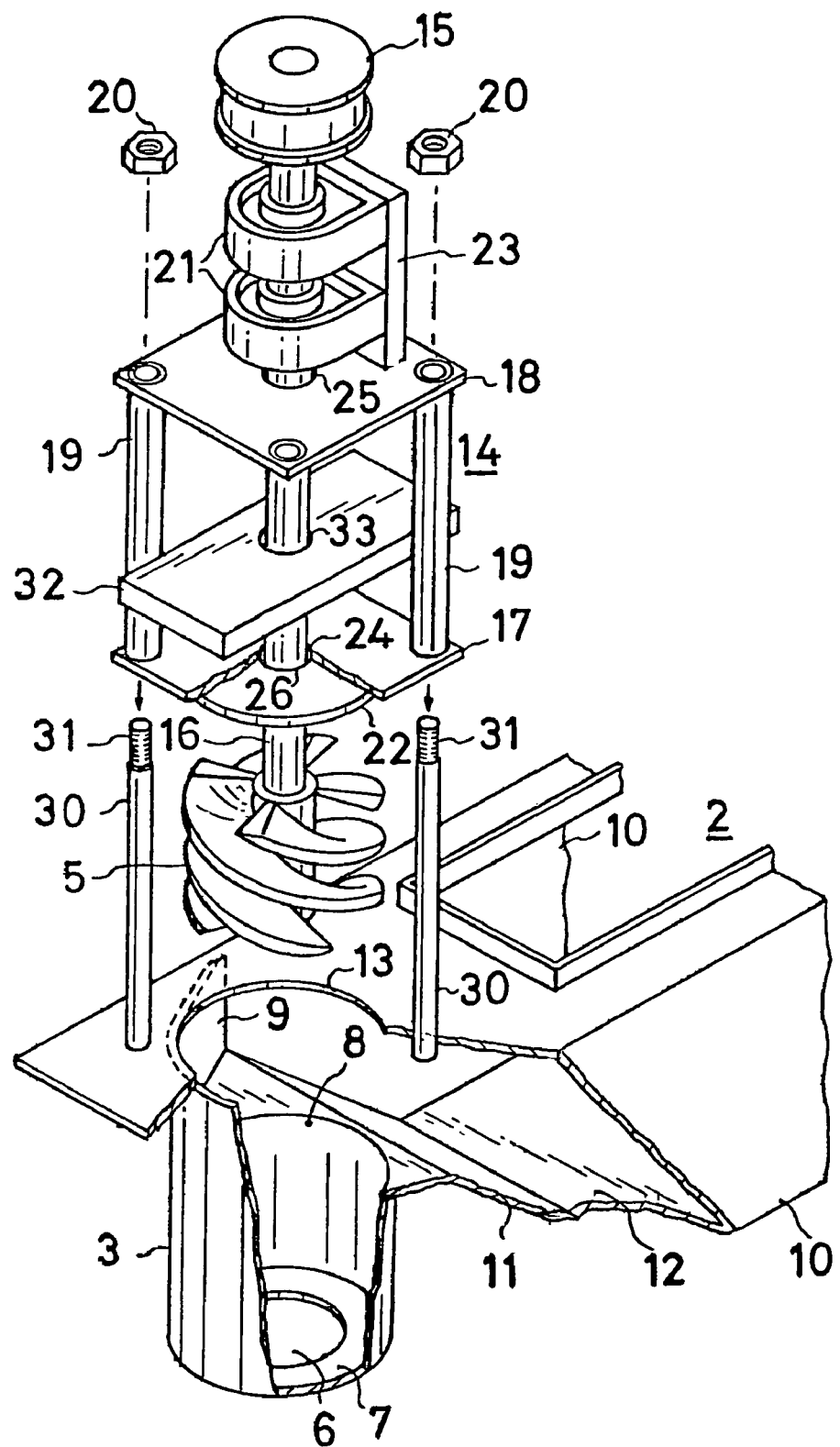
FIG. 2—This is an enlarged partially cross-sectional perspective view of important parts.
Figure 3:
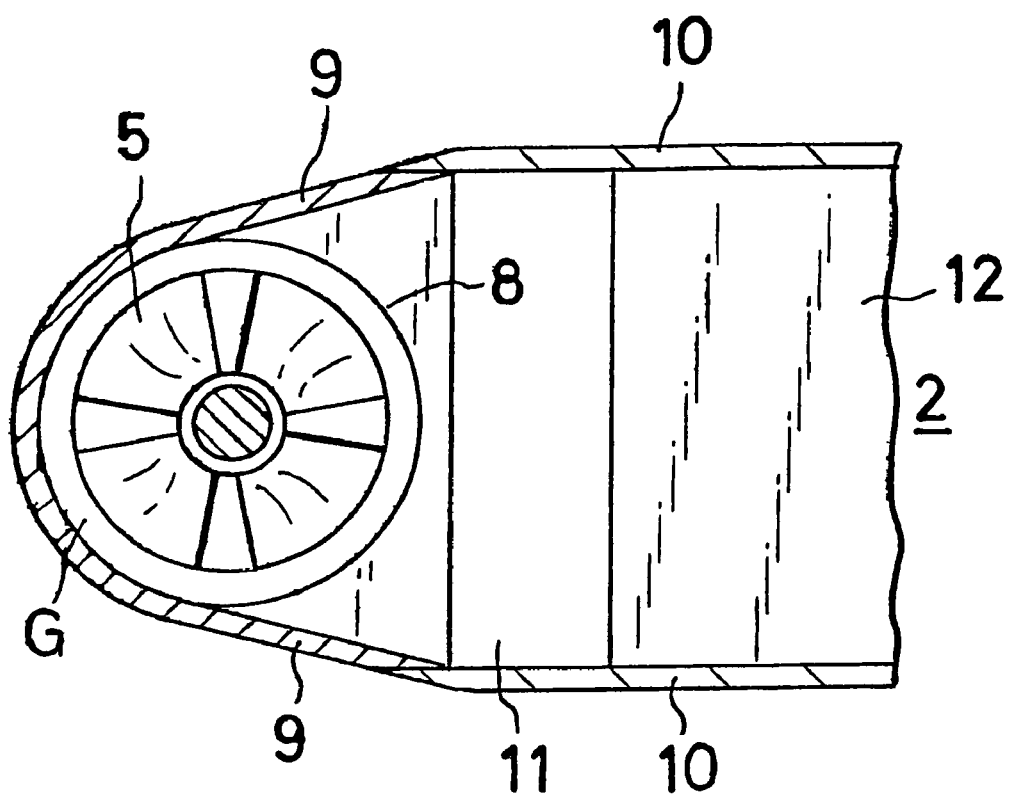
FIG. 3—This is a cross-sectional view along line X-X of FIG. 1.
Figure 4:
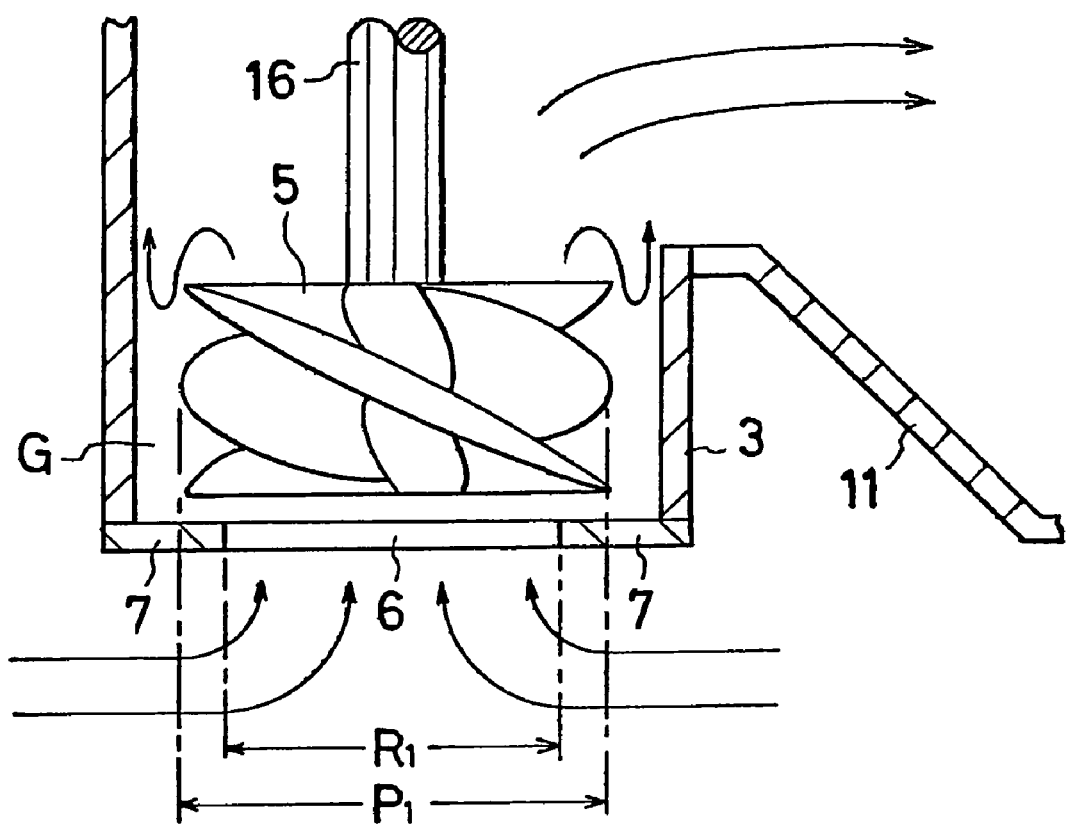
FIG. 4—This is a view explaining the flow of molten solder in a screw pump of a wave soldering tank according to the present invention.
Figure 5:
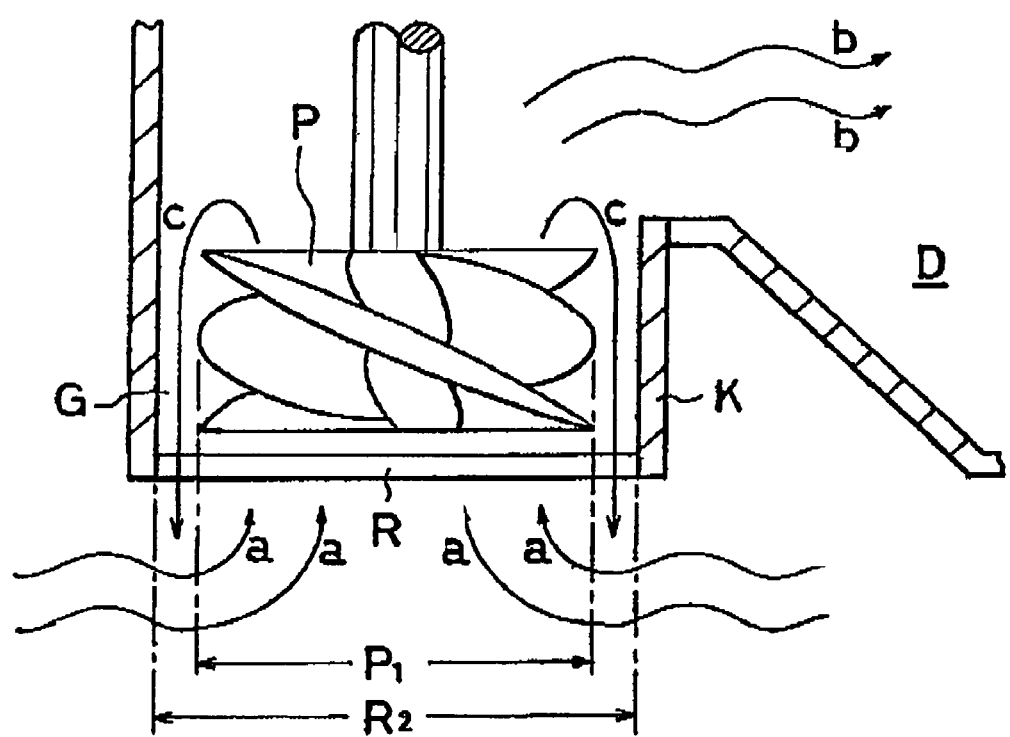
FIG. 5—This is a view explaining the flow of molten solder in a screw pump of a conventional wave soldering tank.

Below, a wave soldering tank according to the present invention will be explained based on the drawings. FIG. 1 is a front cross-sectional view of a wave soldering tank according to the present invention, FIG. 2 is an enlarged partially cross-sectional perspective view of important portions, FIG. 3 is a cross-sectional view taken along line X-X of FIG. 1, and FIG. 4 is a view for explaining the flow of molten solder in a screw pump of a wave soldering tank according to the present invention.

A wave soldering tank according to the present invention has a lidless box-shaped body 1. A duct 2 is installed inside the body. A casing 3 is installed at one end of the duct 2, and a discharge nozzle 4 is installed at the upper portion of the other end. A screw pump 5 is installed inside the casing 3 with a suitable gap G, such as a gap of a size such that the screw pump will not contact the casing even if the screw pump develops a certain amount of eccentricity due to thermal expansion and contraction of solder.

An inlet 6 is formed in the bottom of the casing 3. The inlet 6 is formed by an inner flange 7 at the bottom of the casing 3. As shown in FIG. 4, the diameter $R_1$ of the inlet 6 is smaller than the diameter $P_1$ of the screw pump.

The upper portion of the casing 3 is partially cut away to form an arcuate outlet 8. Outwardly flaring guide walls 9, 9 are formed on both sides of the outlet 8. The ends of the guide walls are secured to both walls 10, 10 of the duct 2. A portion which is flush with the outlet 8 forms a guide plate 11, and the lower portion of the guide plate is secured to the bottom surface 12 of the duct 2.

The duct 2 which forms the top of the casing 3 has a pump insertion hole 13 having roughly the same diameter as the inner diameter of the casing 3, and a shaft holding member 14 is installed above the pump insertion hole. A pump shaft 16 which is secured to the screw pump 5 at its lower end and to a pulley 15 at its upper end is rotatably mounted on the shaft holding member 14.

The shaft holding member 14 is constituted by a lower plate 17, an upper plate 18, four pipes 19, four nuts 20, two bearings 21 and 21, and an inlay board 22. The lower plate 17 and the upper plate 18 are connected by the four pipes 19. The pipes 19 have a length such that when the shaft holding member 14 is disposed atop the duct 2, the pipes project upwards from the liquid surface of the molten solder S by a sufficient amount as shown in FIG. 1.

A bearing plate 23 extends upwards from and is secured to one end of the top of the upper plate 18, and the two bearings 21, 21 are installed on the bearing plate so that the holes in the bearings are concentric and extend vertically. Shaft insertion holes 24 and 25 which are slightly larger in diameter than the pump shaft 16 are concentrically positioned with respect to the bearings 21, 21 at approximately the center of the lower plate 17 and the upper plate 18. The disc-shaped inlay board 22 which serves as a positioning member is secured to the rear surface of the bottom plate 17. The pump insertion hole 13 is utilized as a receiving portion of the duct 2, with the receiving portion fitting over the inlay board 22. As the inlay board 22 is slightly smaller in diameter than the pump insertion hole 13, the inlay board 22 can fit into the pump insertion hole 13 with almost no gap. A shaft insertion hole 26 having roughly the same diameter as the shaft insertion hole 24 of the lower plate 17 is formed at the center of the inlay board. The shaft insertion hole 24 of the lower plate 17 is concentric with the shaft insertion hole 26 of the inlay board 22.

The pump shaft 16 is inserted into the shaft insertion holes 26, 24, and 25 of the inlay board 22, the lower plate 17, and the upper plate 18, respectively, and is rotatably supported by the two bearings 21, 21. The pulley 15 which is mounted on the upper end of the pump shaft 16 is connected by a belt 29 to a pulley 28 of a motor 27 disposed on the exterior of the body 1.

Four columns 30 are erected on the top of the duct 2 in approximately the same locations as the four pipes 19 of the holding member 14. Male threads 31 which can threadingly engage with the nuts 20 are formed at the upper ends of the columns 30. The columns 30 are slightly smaller in diameter than the holes in the pipes 19, and they are longer than the pipes 19 so that when the columns 30 are passed through the pipes 19, the male threads 31 project above the upper plate 18 and can be threadingly engaged with the nuts 20.

A rectangular oxidation preventing float 32 is disposed between the four pipes 19. The oxidation preventing float has a length in the widthwise direction of the tank which is slightly smaller than the separation between two of the pipes 19, 19, and it has a length in the lengthwise direction of the tank which is longer than the separation between two opposing pipes 19, 19. A hole 33 which is slightly larger than the diameter of the pump shaft 16 is formed at approximately its center. A hollow portion is formed in the periphery of the oxidation preventing float 32 to provide buoyancy. When the shaft holding member 14 is installed on the duct, the float 32 floats on the liquid surface of molten solder. The float 32 prevents the formation of oxides in the periphery of the pump shaft 16 when the pump shaft 16 is rotated.

Next, the state in which a wave soldering tank having the above-described structure is spouting solder will be explained. When the motor 27 is driven, the pulley 15 which is connected by the belt 29 to the pulley 28 of the motor 27 is driven and the pump shaft 16 is rotated. When the screw pump 5 rotates with the rotation of the pump shaft 16, the molten solder S below the duct 2 flows from the inlet 6 into the interior of the casing 3. The molten solder which flows into the casing 3 flows in the direction of the discharge nozzle 4 mounted on the duct 2. At this time, since molten solder is present in the duct 2, the molten solder from the screw pump 5 is pushed backwards and flows into the gap G between the casing 3 and the screw pump 5. However, as shown in FIG. 4, because the inlet 6 which is formed at the bottom of the casing 3 has a diameter $R_1$ which is smaller than the diameter $P_1$ of the screw pump 5, molten solder which passes through the gap G does not escape downwards. As a result, the molten solder below the duct can flow into the casing 3 without turbulence, and turbulence has almost no effect on the molten solder which is discharged from the outlet 9 of the casing 3. Accordingly, solder which is not turbulent passes through the duct, and it does not pulse and spouts at a stable height when it spouts from the discharge nozzle.

As Example 1, the diameter of the screw pump was 86 mm, the inner diameter of the casing was 94 mm, the diameter of the inlet was 60 mm, and an Sn-3Ag-0.75Cu (specific gravity of 7.4) lead-free solder was spouted from a wave soldering tank having guide walls which were not outwardly flaring but were perpendicular to the wall surfaces of the duct in the discharge opening. The up and down movement of the liquid surface of a secondary discharge nozzle was precisely measured with a laser measuring apparatus and was found to be 0.2 mm. Example 2 was the same as Example 1 except for guide walls. When the liquid surface of the secondary discharge nozzle in a wave soldering tank having outwardly flaring guide walls was measured with a laser measuring apparatus, the up and down movement of the liquid surface was at most 0.1 mm. A comparative example employed a screw pump, a casing, and a lead-free solder which were the same as in the examples. When the up and down movement of the liquid surface of the secondary discharge nozzle was measured in a wave soldering tank which had an inlet with the same inner diameter as the casing of 94 mm, the up and down movement of the liquid surface in the comparative example was 0.7 mm, and there was clear pulsing.

INDUSTRIAL APPLICABILITY

A wave soldering tank according to the present invention can be employed not only with a secondary discharge nozzle which spouts a gentle wave but can also of course be employed with a primary discharge nozzle which spouts a turbulent wave. Even a wave soldering tank which does not experience pulsation when using a Pb—Sn solder having a high specific gravity can easily experience pulsation when using a lead-free solder having Sn as a main component which has a low specific gravity. However, a wave soldering tank according to the present invention does not experience pulsing even when a lead-free solder is used.

The invention claimed is:

1. A wave soldering tank comprising a tank body, a duct disposed in the tank body and having first and second ends, a casing disposed at the first end of the duct and having a downwardly-facing inlet at its lower end, an outlet spaced from the inlet and communicating with the duct, a wall disposed between the inlet and the outlet and late connected to a periphery of the wall, a discharge nozzle disposed at the second end of the duct, and a screw pump disposed in the casing and surrounded by the wall of the casing, the inlet of the casing comprising an opening which is formed in the plate beneath the screw pump and which has a diameter which is smaller than a diameter of the screw pump, a line coinciding with a rotational axis of the screw pump passing through a center of the opening.

2. A wave soldering tank as claimed in claim 1 wherein the casing includes a pair of outwardly flaring guide walls which are connected to the duct and between which fluid discharged from the outlet flows into the duct.

3. A wave soldering tank as claimed in claim 2 wherein the casing comprises a cylindrical lower portion housing the screw pump and an upper portion including the guide walls and an arcuate wall which is disposed on an opposite side of the casing from the outlet and which is defined by a portion of a cylinder and which extends between the guide walls.

4. A method of soldering using the wave soldering tank of claim 1 comprising rotating the screw pump to generate a pumping force which draws molten solder into the inlet of the casing, discharges the molten solder from the outlet into the duct, passes the molten solder through the duct, and discharges the molten solder from the nozzle as a solder wave, and passing an object to be soldered through the solder wave.

5. A wave soldering tank as claimed in claim 1 wherein the plate comprises a flange extending radially inwards from a lower end of the wall beneath the screw pump, the an opening being formed in a center of the flange.

6. A wave soldering tank as claimed in claim 1 including a pump shaft secured to the screw pump and a bearing for the pump shaft disposed above the screw pump, the pump shaft being unsupported below the screw pump.

7. A wave soldering tank as claimed in claim 3 wherein the guide walls extend tangentially from the arcuate wall.

8. A wave soldering tank as claimed in claim 3 wherein the outlet has a lower end disposed above an upper end of the screw pump.

9. A wave soldering tank as claimed in claim 1 wherein the plate completely surrounds the line coinciding with the rotational axis of the screw pump.

10. A wave soldering tank as claimed in claim 6 wherein the pump shaft extends into the casing through an opening in a top surface of the duct.

11. A wave soldering tank as claimed in claim 2 wherein the guide walls of the casing extend to a top of the duct.

12. A wave soldering tank comprising a tank body, a duct disposed in the tank body and having first and second ends, a cylindrical wall disposed at the first end of the duct and having an upper end communicating with an interior of the duct and a lower end, a discharge nozzle disposed at the second end of the duct, a screw pump surrounded by the cylindrical wall, and a plate which is connected to a lower end of the cylindrical wall beneath the screw pump and has a downwardly-facing opening formed therein which comprises an inlet for the screw pump and which has a diameter which is smaller than a diameter of the screw pump, a line coinciding with a rotational axis of the screw pump passing through a center of the opening.

13. A wave soldering tank as claimed in claim 12 wherein the plate comprises a flange extending radially inwards from a lower end of the cylindrical wall beneath the screw pump, the opening being in a center of the flange.

* * * * *